United States Patent [19]

Hirooka et al.

[11] Patent Number: 4,812,331

[45] Date of Patent: Mar. 14, 1989

[54] METHOD FOR FORMING DEPOSITED FILM CONTAINING GROUP III OR V ELEMENT BY GENERATING PRECURSORS WITH HALOGENIC OXIDIZING AGENT

[75] Inventors: Masaaki Hirooka, Toride; Masao Ueki, Urayasu; Jun-Ichi Hanna; Isamu Shimizu, both of Yokohama, all of Japan

[73] Assignee: Canon Kabushiki Kaisha, Tokyo, Japan

[21] Appl. No.: 942,210

[22] Filed: Dec. 16, 1986

[30] Foreign Application Priority Data

Dec. 16, 1985 [JP] Japan .................. 60-282202

[51] Int. Cl.$^4$ .................................. C23C 16/00
[52] U.S. Cl. .................. 427/255.1; 427/255; 427/255.2; 437/225; 437/234; 437/236
[58] Field of Search .................. 427/255.2, 255.3, 87, 427/255, 255.1; 437/225, 234, 236

[56] References Cited

U.S. PATENT DOCUMENTS

| Re. 31,708 | 10/1984 | Gordon | 427/126.2 |
|---|---|---|---|
| 3,306,768 | 2/1967 | Peterson | 117/106 |
| 3,473,978 | 10/1969 | Jackson et al. | 148/175 |
| 3,888,705 | 6/1975 | Fletcher et al. | 148/175 |
| 4,146,657 | 3/1979 | Gordon | 427/126 |
| 4,239,811 | 12/1980 | Kemlage | 427/95 |
| 4,250,205 | 2/1981 | Constant et al. | 427/87 |
| 4,357,179 | 11/1982 | Adams et al. | 148/1.5 |
| 4,402,762 | 9/1983 | John et al. | 156/613 |
| 4,421,592 | 12/1983 | Shaskus et al. | 148/1.5 |
| 4,436,769 | 3/1984 | Moss et al. | 427/255.2 |
| 4,448,801 | 5/1984 | Fukuda et al. | 427/39 |
| 4,462,847 | 7/1984 | Thompson et al. | 427/38 |
| 4,504,518 | 3/1985 | Ovshinsky et al. | 427/39 |
| 4,522,663 | 6/1985 | Ovshinsky et al. | 427/39 |
| 4,532,199 | 7/1985 | Ueno et al. | 427/39 |
| 4,554,180 | 11/1985 | Hirooka | 427/248.1 |
| 4,595,601 | 6/1986 | Horioka et al. | 427/53.1 |
| 4,615,905 | 10/1986 | Ovshinsky | 427/39 |
| 4,624,736 | 11/1986 | Gee et al. | 156/643 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/255.2 |
| 4,652,463 | 3/1987 | Peters | 427/53.1 |
| 4,657,777 | 4/1987 | Hirooka | 427/39 |
| 4,689,093 | 8/1987 | Ishihara et al. | 427/39 |
| 4,751,192 | 6/1988 | Hirooka et al. | 437/4 |

FOREIGN PATENT DOCUMENTS

| 74212 | 3/1983 | European Pat. Off. | 427/248.1 |
|---|---|---|---|
| 90586A | 10/1983 | European Pat. Off. | 427/39 |
| 8503727 | 8/1985 | European Pat. Off. | 427/87 |
| 2830081 | 2/1979 | Fed. Rep. of Germany | 427/87 |
| 59-199035 | 12/1984 | Japan | 427/39 |
| 60-43819 | 8/1985 | Japan | 427/38 |
| 2038086A | 7/1980 | United Kingdom | 427/248.1 |
| 2148328A | 5/1985 | United Kingdom | 427/248.1 |

OTHER PUBLICATIONS

Ohnishi et al., Proceedings, 6th E.C. Photovoltaic Solar Energy Conference, London, Apr. 15–19, 1985.
Sakai et al., Proceedings, 6th E.C. Photovoltaic Solar Energy Conference, London, Apr. 15–19, 1985.
Brodsky et al., 22 IBM Technical Disclosure Bulletin 3391 (Jan. 1980).
Inoue, Appl. Phys. Lett. 43(8), Oct. 15, 1983, p. 774.

Primary Examiner—Sadie Childs
Attorney, Agent, or Firm—Fitzpatrick, Cella, Harper & Scinto

[57] ABSTRACT

A method for forming a deposited film, which comprises introducing gaseous starting materials, containing group III and/or group V compound as the constituent element for formation of a deposited film and a gaseous halogenic oxidizing agent having the property of oxidation action on said starting materials into a reaction space to effect contact therebetween to thereby form a plural number of precursors containing precursors under excited state, and forming a deposited film of a substrate existing in a film-forming space with the use of at least one precursor of said precursors as the feeding source for the constituent element of the deposited film.

6 Claims, 2 Drawing Sheets

METHOD FOR FORMING DEPOSITED FILM CONTAINING GROUP III OR V ELEMENT BY GENERATING PRECURSORS WITH HALOGENIC OXIDIZING AGENT

BACKGROUND OF THE INVENTION

1. Field of the Invention

This invention relates to a method for formation of an amorphous or crystalline functional thin film such as semiconductor film, insulating film, conductive film, etc., particularly a deposited film which is useful for uses such as active or passive semiconductor device, photosemiconductive device or photosensitive device for solar battery or electrophotography etc.

2. Related Background Art

For formation of deposited films, there have been attempted the vacuum vapor deposition method, the plasma CVD method, the thermal CVD method, the optical CVD method, the reactive sputtering method, the ion plating method, etc. Generally, the plasma CVD method has been widely used and industrialized.

However, the deposited films obtained according to these methods for formation of deposited films have been demanded to be applied for electronic devices or photoelectronic devices for which higher functions are demanded, and therefore there is room left for improvement of further improvement of overall characteristics with respect to electrical and optical characteristics, and fatigue characteristic or use environmental characteristic in repeated use, and further productivity, bulk productivity, including uniformness, reproducibility, etc.

The reaction process in formation of a deposited film according to the plasma CVD method which has been generalized in the prior art is considerably complicated as compared with the thermal CVD method of the prior art, and its reaction mechanism involves not a few ambiguous points. Also, there are a large number of parameters for formation of a deposited film (for example, substrate temperature, flow rate and flow rate ratio of the introduced gases, pressure during formation, high frequency power, electrode structure, structure of the reaction vessel, speed of evacuation, plasma generating system, etc.). Because of the combination of such a large number of parameters, the plasma may sometimes become unstable state, whereby marked deleterious influences were exerted frequently on the deposited film formed. Besides, the parameters characteristic of the device must be selected for each device and therefore under the present situation it has been difficult to generalize the production conditions.

Among them, for example, in the case of the group III-V compound semiconductor film, with respect to exhibiting sufficiently satisfactory electric and optical characteristics for respective uses, it has been proposed to form it according to the plasma CVD method.

However, depending on the application use of the deposited film, bulk production having reproducibility must be attempted with full satisfaction of enlargement of area, uniformity of film thickness as well as uniformity of film quality, and therefore in formation of a deposited film according to the plasma CVD method, enormous installation investment is required for a bulk production device and also management items for such bulk production become complicated, with a width of management tolerance being narrow and the control of the device being severe. These are pointed as the problems to be improved in the future.

On the other hand, according to the technique of the prior art by conventional CVD method, high temperature is required and a deposited film having satisfactory characteristics on industrial level could not necessarily be obtained.

These remain to be greater problems particularly in the case of forming a thin deposited film of the group III-V compounds.

As described above, in formation of functional films, it has been earnestly desired to develop a method for forming a deposited film which is capable of bulk production by means of a device of low cost, while maintaining the characteristics as well as uniformity which are practicably available.

SUMMARY OF THE INVENTION

An object of the present invention is to remove the drawbacks of the method for forming deposited films as described above and at the same time to provide a novel method for forming a deposited film without use of the formation method of the prior art.

Another object of the present invention is to attempt to save energy and at the same time to provide a method for forming a deposited film capable of obtaining a deposited film with uniform characteristics over a large area with easy management of film quality.

Still another object of the present invention is to provide a method for forming a deposited film by which a film excellent in productivity and bulk productivity, having high quality as well as excellent physical characteristics such as electrical, optical and semiconductor characteristics can be easily obtained.

The method for forming a deposited film of the present invention which can accomplish the above objects comprises introducing gaseous starting materials for formation of a deposited film and a gaseous halogenic oxidizing agent having the property of oxidation action on said starting materials into a reaction space to effect contact therebetween to thereby chemically form precursors under excited state, and forming a deposited film on a substrate existing in a film-forming space, which connects spatially with the reaction space, with the use of said precursors as the feeding source for the constituent element of the deposited film.

DESCRIPTION OF THE PREFERRED EMBODIMENT

Figure 1:
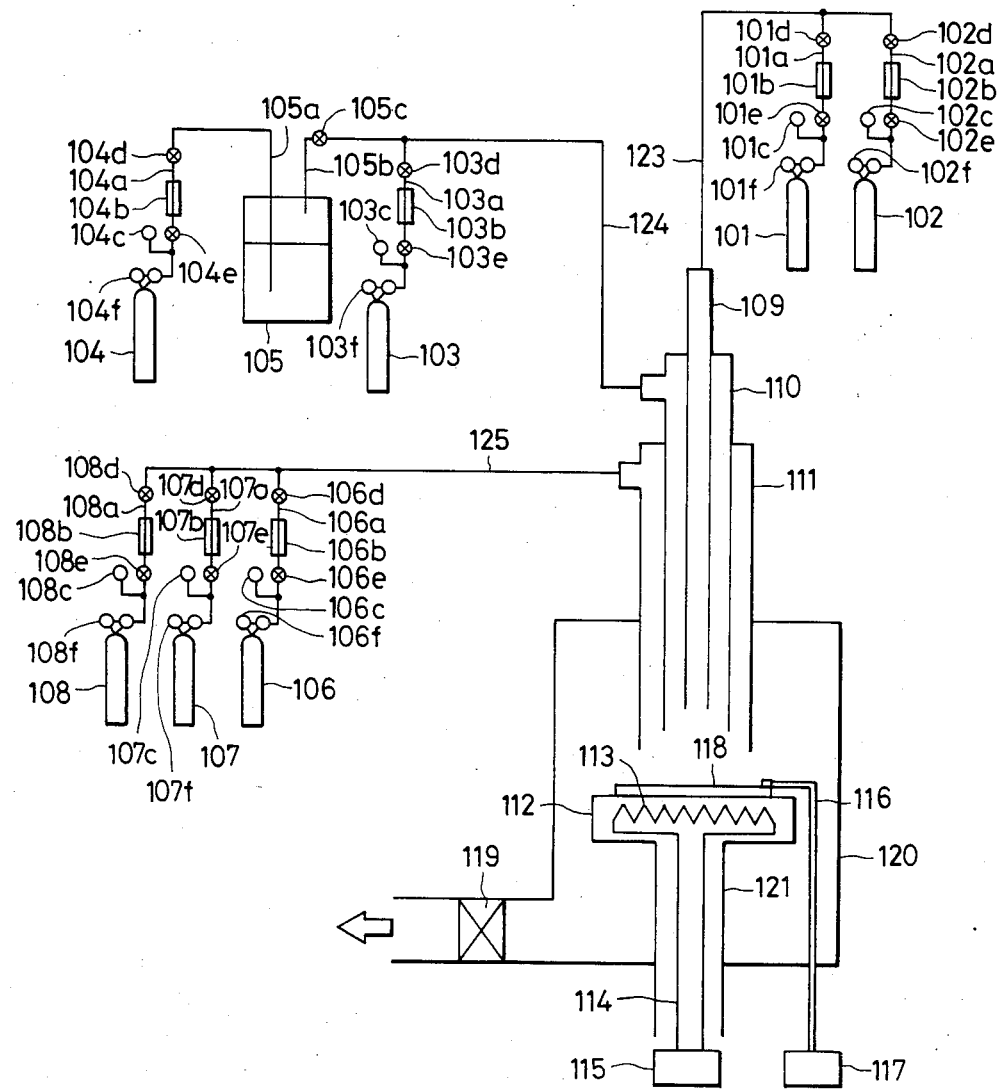
FIG. 1 and FIG. 2 each show a schematic illustration of a film forming device used in Examples of the present invention.

According to the method for forming a deposited film of the present invention, simplification of management and bulk production can be effected with full satisfaction of enlargement of area, uniformity of film thickness, and uniformity of film quality simultaneously with saving energy, without requiring no enormous installation investment for bulk production apparatus, and also the management items for its bulk production become clear to afford broad width of management tolerance and simple control of the device.

In the method for forming a deposited film of the present invention, the gaseous starting materials for formation of a deposited film receive oxidizing action through chemical contact with a gaseous halogenic oxidizing agent and can be selected suitably as desired depending on the kind, the characteristic, use, etc., of the desired deposited film. In the present invention, the above gaseous starting materials and the gaseous halogenic oxidizing agent may be those which can be made gaseous when being contacted with each other, and they can be either liquid or solid in ordinary state.

When the starting materials for formation of a deposited film or the halogenic oxidizing agent is liquid or solid, the starting materials for formation of a deposited film and the halogenic oxidizing agent are introduced in gaseous state into the reaction space while performing bubbling with the use of carrier gas such as Ar, He, $N_2$, $H_2$, etc., optionally with application of heat.

During this operation, the partial pressures and mixing ratio of the above gaseous starting materials and the gaseous halogenic oxidizing agent can be set by controlling the flow rate of the carrier gas and the vapor pressures of the starting materials for formation of the deposited film and the gaseous halogenic oxidizing agent.

The gaseous starting compounds of the group III and the group V for formation of a deposited film to be used in the present invention may include hydrides, halides, alkyl compounds, oxy compounds, etc. of the respective elements.

Specific examples of aluminum compounds may include $AlCl_3$, $AlBr_3$, $AlI_3$, $Al(CH_3)_2Cl$, $Al(CH_3)_3$, $Al(OCH_3)_3$, $Al(CH_3)Cl_2$, $Al(C_2H_5)_3$, $Al(OC_2H_5)_3$, $Al(CH_3)_3$, $Al(i-C_4H_9)_3$, $Al(i-C_3H_7)_3$, $Al(C_3H_7)_3$, $Al(OC_4H_9)_3$, etc.

Specific examples of gallium compounds may include $GaCl_3$, $GaI_3$, $GaBr_3$, $Ga(OCH_3)_3$, $Ga(OC_2H_5)_3$, $Ga(OC_3H_7)_3$, $Ga(OC_4H_9)_3$, $Ga(CH_3)_3$, $Ga_2H_6$, $GaH(C_2H_5)_2$, $Ga(OC_2H_5)(C_2H_5)_2$, etc.

Specific examples of indium compounds may include $In(CH_3)_3$, $In(C_3H_7)_3$, $In(C_4H_9)_3$, etc.

Specific examples of phosphorus compounds may include $PF_3$, $PF_5$, $PCl_3$, $PCl_5$, $POCl_3$, $POBr_3$, $PO(OCH_3)_3$, $PO(OC_2H_5)_3$, $PO(C_3H_7)_3$, $PO(OC_4H_9)_3$, $PBr_3$, $PBr_5$, $P(CH_3)_3$, $P(C_2H_5)_3$, $P(C_3H_7)_3$, $P(C_4H_9)_3$, $P(OCH_3)_3$, $P(OC_2H_5)_3$, $P(OC_3H_7)_3$, $P(OC_4H_9)_3$, $PSF_3$, $PSCl_3$, $P(SCN)_3$, $P_2H_4$, $PH_3$, etc.

Specific examples of arsenic compounds may include $AsH_3$, $AsCl_3$, $AsBr_3$, $As(OCH_3)_3$, $As(OC_2H_5)_3$, $As(OC_3H_7)_3$, $As(OC_4H_9)_3$, $As(CH_3)_3$, $As(CH_3)_3$, $As(C_2H_5)_3$, $As(C_6H_5)_3$, etc.

Specific examples of antimony compounds may include $SbF_3$, $SbF_5$, $SbCl_3$, $SbCl_5$, $SbBr_3$, $Sb(OCH_3)_3$, $Sb(OC_2H_5)_3$, $Sb(OC_3H_7)_3$, $Sb(OC_4H_9)_3$, $Sb(CH_3)_3$, $Sb(C_3H_7)_3$, $Sb(C_4H_9)_3$, etc.

The halogenic oxidizing agent to be used in the present invention is made gaseous on introduction into the reaction space and at the same time has the property of effectively oxidizing the gaseous starting materials for formation of a deposited film introduced into the reaction space by mere chemical contact therewith, including halogen gas such as $F_2$, $Cl_2$, $Br_2$, $I_2$, etc., and fluorine, chlorine, bromine, etc., under nascent state as effective ones.

These halogenic oxidizing agents are introduced into the reaction space under gaseous state together with the gases of the starting materials for formation of a deposited film as described above at a desired flow rate and a feeding pressure being given, wherein they are mixed with and collided against the above starting materials to be contacted therewith, thereby oxidizing the above starting materials to generate efficiently a plural kinds of precursors containing precursors under excited state.

Of the precursors under excited state and other precursors generated, at least one of them functions as the feeding source for the constituent element of the deposited film formed.

The precursors generated may undergo decomposition or reaction to be converted to other precursors under excited state or to precursors under another excited state, or alternatively in their original forms, if desired, although releasing energy to contact the substrate surface arranged in a film-forming space, whereby a deposited film having a three-dimensional network structure is prepared.

In the present invention, so that the deposit film forming process may proceed smoothly to form a film of high quality and having desired physical characteristics, as the film forming factors, the kinds and combination of the starting materials and the halogenic oxidizing agent, mixing ratio of these, pressure during mixing, flow rate, the inner pressure in the film-forming space, the flow rates of the gases, the film forming temperature (substrate temperature and atmosphere temperature) are suitably selected as desired. These film-forming factors are organically related to each other, and they are not determined individually but determined respectively under mutual relationships. In the present invention, the ratio of the gaseous starting materials for formation of a deposited film and the gaseous halogenic oxidizing agent introduced into the reaction space may be determined suitably as desired in relationship of the film-forming factors related among the film-forming factors as mentioned above. The ratio is preferably 1/20 to 100/1, more preferably 1/5–50/1 in terms of flow rate ratio introduced.

The pressure during mixing on the introduction into the reaction space may be preferably higher in order to make higher the chemical contact between the above gaseous starting materials and the above gaseous halogenic oxidizing agent in probability. It is better to determine the optimum value suitably as desired in view of the reactivity. Although the pressure during mixing may be determined as described above, each of the pressure during introduction may be preferably $1 \times 10^{-7}$ atm to 10 atm, more preferably $1 \times 10^{-6}$ atm to 3 atm.

The pressure within the film forming space, namely the pressure in the space in which the substrate for forming a film thereon is arranged may be set suitably as desired so that the precursors (E) under the state generated in the reaction space and sometimes the precursors (D) formed as secondary products from said precursors (E) may contribute effectively to film formation.

The inner pressure in the film forming space, when the film-forming space is openly continuous to the reaction space, can be controlled in relationship with the introduction pressures and flow rates of the gaseous starting materials for formation of a deposited film and a gaseous halogenic oxidizing agent in the reaction space, for example, by application of a contrivance such as differencial evacuation or use of a large scale evacuating device.

Alternatively, when the conductance at the connecting portion between the reaction space and the film-forming space is small, the pressure in the filmforming space can be controlled by providing an appropriate evacuating device in the film-forming space and controlling the evacuation amount of said device.

On the other hand, when the reaction space and the film-forming space is intergrally made and the reaction position and the film-forming position are only spatially different, it is possible to effect differential evacuation or provide a large scale evacuating device having sufficient evacuating capacity as described above.

As described above, the pressure in the filmforming space may be determined in the relationship with the introduction pressures of the gaseous starting materials and the gaseous halogenic oxidizing agent introduced into the reaction space. The pressure is preferably 0.001 Torr to 100 Torr, more preferably 0.01 Torr to 30 Torr, optimally 0.05 to 10 Torr.

As for the flow type of the gases, it is necessary to design the flow type in view of the geometric arrangement of the gas introducing inlet, the substrate, and the gas evacuating outlet so that the starting materials for formation of a deposited film and the halogenic oxidizing agent may be efficiently mixed during introduction of these into the reaction space, the above precursors (E) may be efficiently generated and the film formation may be adequately carried out without trouble. A preferable example of the geometric arrangement is shown in FIG. 1.

As the substrate temperature (Ts) during the film formation, it can be set suitably as desired individually depending on the gas species employed and the kinds and the required characteristics of the deposited film formed. In the case of obtaining a film of III-V compounds, it is preferably from room temperature to 800° C., more preferably from 50° to 400° C. Particularly, in the case of forming a silicon deposited film having better semiconductor characteristics and photoconductive characteristics, etc., the substrate temperature (Ts) should desirably be made 200° to 600° C. Also, in the case of obtaining a polycrystalline film, it should desirably be made 200° to 650° C., more preferably 300° to 600° C.

As the atmosphere temperature (Tat) in the film-forming space, it may be determined suitably as desired in the relationship with the substrate temperature (Ts) so that the above precursors (E) generated and the above precursors (D) can not be changed to unsuitable chemical species for film formation, and also the above precursors (E) may be efficiently generated.

The substrate to be used in the present invention may be either electroconductive or electrically insulating, provided that it is selected as desired depending on the use of the deposited film formed. As the electroconductive substrate, there may be mentioned metals such as NiCr, stainless steel, Al, Cr, Mo, Au, In, Ir, Nb, Ta, V, Ti, Pt, Pd etc. or alloys thereof.

As insulating substrates, there may be conventionally used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers, and so on. At least one side surface of these substrates is preferably subjected to treatment for imparting electroconductivity, and it is desirable to provide other layers on the side at which said electroconductive treatment has been applied.

For example, an electroconductive treatment of glass can be effected by providing a thin film of NiCr, Al, Cr, Mo, Au, In, Ir, Nb, Ta, V, Ti, Pt, Pd, $In_2O_3$, $SnO_2$, ITO ($In_2O_3+SnO_2$) on the surface thereof. Alternatively, a synthetic resin film such as polyester film can be subjected to the electroconductive treatment on its surface by the vacuum vapor deposition, the electron-beam deposition or the sputtering of a metal such as NiCr, Al, Ag, Pb, Zn, Ni, Au, Cr, Mo, In, Ir, Nb, Ta, V, Ti, Pt, etc., or by a laminating treatment with said metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion between both is great, a large amount of strains may be created within the film to give sometimes no film of good quality, and therefore it is preferable to use a substrate so that the difference in thermal expansion between both is small.

Also, the surface state of the substrate is directly related to the structure of the film (orientation) or generation of a stylet structures, and therefore it is desirable to treat the surface of the substrate so that a film structure and a film texture which give desired characteristics may be obtained.

FIG. 1 shows an example of a preferable device for practicing the method for forming a deposited film of the present invention.

The deposited film forming device shown in FIG. 1 is broadly classified into the three of a main device, an evacuation system and a gas feeding system.

In the main device, a reaction space and a film forming space are provided.

101-104 and 106-108 are respectively bombs filled with the gases to be used during the film formation, 101a-108a and 105b are respectively gas feeding pipes, 101b-104b and 106b-108b are respectively mass flow controllers for controlling the flow rates of the gases from the respective bombs, 101c-104c and 106c-108c are respectively gas pressure gauges, 101d-104d, 106d-108d, 101e-104e, 106e-108e, and 105c are respectively valves, 101f-104f and 106f-108f are respectively pressure gauges indicating the pressures in the corresponding gas bombs, and 105 is a Dewar bottle.

120 is a vacuum chamber equipped at the upper portion with a pipeline for gas introduction, having a structure for formation of the reaction space downstream of the pipeline, and also having a structure for formation of a film-forming space in which a substrate holder 112 is provided so that a substrate 118 may be provided as opposed to the gas discharging outlet of said pipeline. The pipeline for gas introduction has a triple concentric arrangement structure, having from the innerside a first gas introducing pipe 109 for introducing the gases from the gas bombs 101 and 102, a second gas introducing pipe 110 for introducing the gases from the gas bombs 103 and 104 and a Dewar bottle 105, and a third gas introducing pipe 111 for introducing the gases from the gas bombs 106-108.

For gas evacuation to the reaction space of each gas introducing pipe, each position is designed so as to be arranged at a position further from the surface position of the substrate as the pipe is nearer to the inner side. In other words, the gas introducing pipes are arranged so that the pipe on the outer side may enclose the pipe existing within the innerside thereof.

The gases from the respective bombs are fed into the respective introducing pipes through the gas feeding pipelines 123-125, respectively.

The respective gas introducing pipes, the respective gas feeding pipelines and the vacuum chamber 120 are evacuated to vacuum through the main vacuum valve 119 by means of a vacuum evacuating device not shown.

The substrate 118 is set at a suitable desired distance from the positions of the respective gas introducing pipes by moving vertically the substrate holder 112.

In the case of the present invention, the distance between the substrate and the gas discharging outlet of the gas introducing pipe may be determined appropriately in view of the kinds and the desired characteristics of the deposited film formed, the gas flow rates, the inner pressure in the vacuum chamber, etc. It is preferably several mm to 20 cm, more preferably 5 mm to about 15 cm.

113 is a heater for heating the substrate which is provided in order to heat the substrate to an appropriate temperature during film formation, to preheat the substrate 118 before film formation, or further to anneal the film after film formation.

The substrate heating heater 113 is supplied with power through a conductive wire 114 from a power source 115.

116 is a thermocouple for measuring the substrate temperature (Ts) and is electrically connected to the temperature display device 117.

Figure 2:
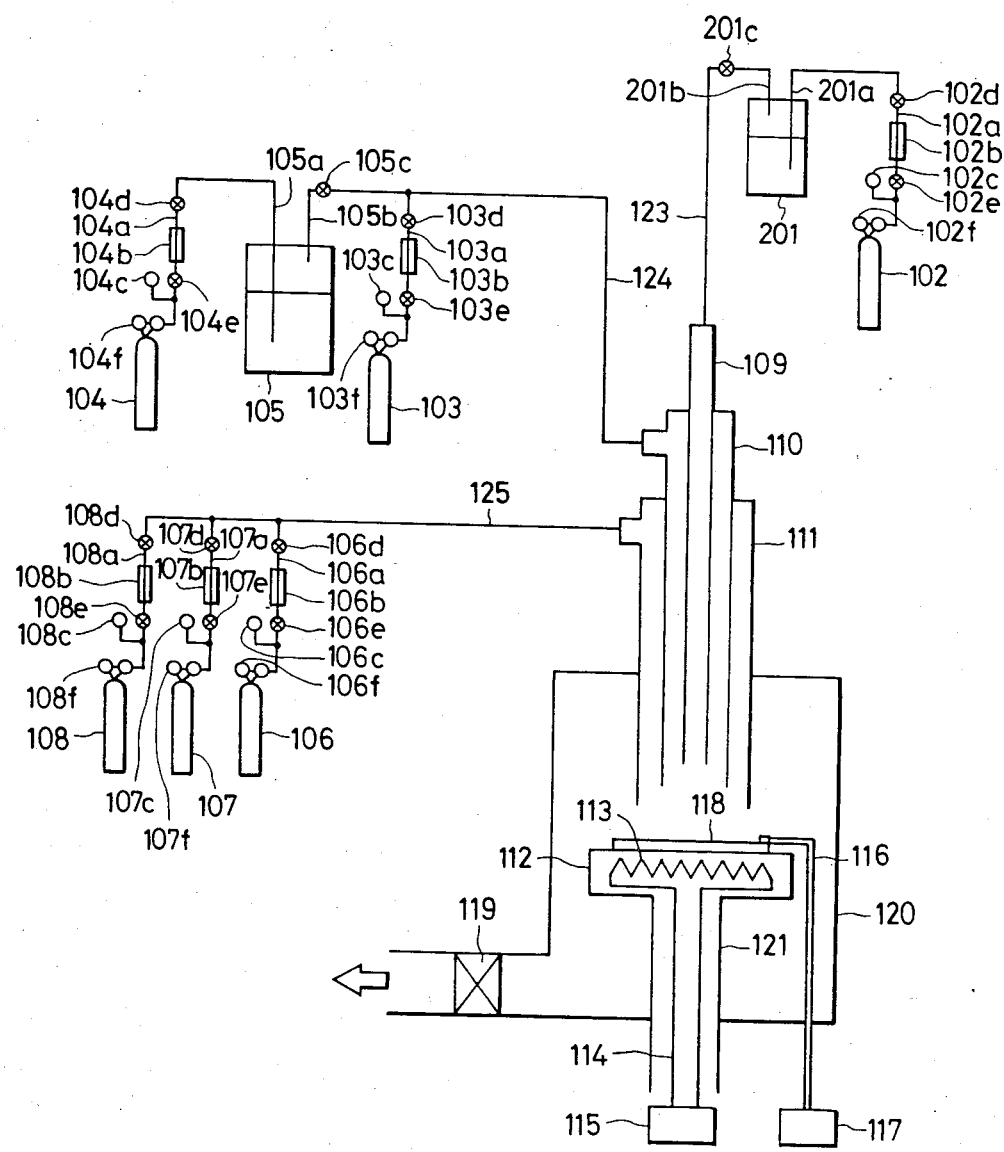

FIG. 2 shows another example of a preferable device for practicing the method for forming a deposited film of the present invention.

The deposited film forming device shown in FIG. 2, 201 is a Dewar bottle, 201a and 201b are respectively gas feeding pipes, and 201c is a valve. A starting material for film formation contained in the Dewar bottle 201 is bubbled with a gas for bubbling, which is contained in a bomb 102.

Other designations same as in FIG. 1 represent the same as in FIG. 1.

The present invention will be described in more detail by referring to the following Examples.

EXAMPLE 1

By means of the device shown in FIG. 1, a deposited film according to the present invention was prepared in the following manner.

Here, of the group III-V compounds, the formation of GaAs is described as an example. With the use of hydrogen gas filled in the bomb 104 as the carrier gas, it was introduced into the Dewar bottle 105 containing trimethyl gallium ((CH$_3$)$_3$Ga) to effect bubbling therein, and the hydrogen gas containing saturated amount of tirmethyl gallium was introduced into the vacuum chamber 120 through the gas introducing inlet 110.

The gas flow rate at this time was 30 sccm with the amount of trimethyl gallium fed being 0.04 ml/min.

On the other hand, arsine AsH$_3$ filled in the bomb 101 was introduced from the introducing pipe 123 at 40 sccm through the gas introducing inlet 109 into the chamber 120.

As the gaseous halogen having oxidative action on the starting materials as described above, F$_2$ gas was employed and introduced from the filled bomb 106 through the introducing pipe 125 at a flow rate of 40 sccm into the chamber 120.

During this operation, the pressure in the vacuum chamber 120 was controlled to 2 Torr by controlling the opening of the vacuum valve 119. By use of Al$_2$O$_3$ (2 cm×2 cm) as the substrate, the distance between the gas introducing inlet 111 and the substrate was set at 3 cm. Bluish white luminescence was strongly observed in the region where the starting gases were mixed with F$_2$ gas. The substrate temperature (Ts) was set for respective samples at a temperature of from 500° to 800° C. as indicated in Table 1.

The GaAs films formed were all confirmed to be crystalline by electron beam diffraction.

The film thickness of each sample was determined with a layer thickness measuring apparatus of Alpha-Step (produced by TENCOR Co.).

Then, on the GaAs film of each sample, a comb-shaped electrode (gap length 200 μm) of aluminum was vapor deposited to prepare a sample for measurement of electroconductivity. Each sample was placed in a vacuum cryostat and the current was measured by a minute amperemeter (YHP4140B manufactured by YOKOKAWA HEWLETT-PACKARD Company) to determine resistivity ρ.

These results are shown in Table 1.

TABLE 1

| Sample No. | Substrate temperature (C.°) | Deposition speed (Å/S) | Film thickness (μm) | Resistivity ρ (Ω · cm) |
|---|---|---|---|---|
| 1 | 500 | 100 | 7.0 | 0.36 |
| 2 | 600 | 100 | 7.0 | 0.25 |
| 3 | 700 | 80 | 5.6 | 0.24 |
| 4 | 800 | 70 | 4.7 | 0.10 |

EXAMPLE 2

Example 1 was repeated except that PH$_3$ was introduced into the chamber 120 from the gas introducing inlet 109 through the introducing pipe 123.

The flow rate was 20 sccm for PH$_3$ gas and 30 sccm for H$_2$ gas for bubbling Ga(CH$_3$)$_3$.

Example 1 was repeated except that the substrate was Al$_2$O$_3$ and the substrate temperature 600° C.

For the thus prepared samples 1-17 to 1-21, the film thickness were measured in the same manners as in Example 1.

Table 2 shows the relationships between the inner pressures, film thickness t, and the optical band gap (Eg opt).

TABLE 2

| Sample No. | 1-17 | 1-18 | 1-19 | 1-20 | 1-21 |
|---|---|---|---|---|---|
| Inner pressure | 10 m Torr | 100 m Torr | 1 Torr | 10 Torr | 100 Torr |
| Film thickness (μm) | 0.4 | 1.2 | 1.8 | 1.0 | 0.5 |
| Eg opt (eV) | 2.24 | 2.20 | 2.15 | 2.15 | 2.10 |

Eg opt was calculated by the TAUC plot method from the results obtained by spectrophotometric determination with a spectrophotometer (produced by HITACHI-SEISAKUSHO No. 330).

The GaP deposited was confirmed to be crystalline as the result of electron beam diffraction.

EXAMPLE 3

By means of the device shown in FIG. 2, a deposited film was prepared according to the method of the present invention.

Here, of the III-V compounds, GaSb was formed as an example. With the use of the hydrogen gases filled in the bombs 104 and 102 as the carrier gas, they were introduced into a Dewar bottle 105 containing (CH$_3$)$_3$Ga and a Dewar bottle 201 containing SbH$_3$, respectively, to effect bubbling therein and hydrogen gases containing saturated amounts of $(CH_3)_3Ga$ and $SbH_3$ were introduced into the chamber 120 through the introducing inlets 110 and 109, respectively.

The gas flow rates at this time were each 40 sccm.

As the gaseous halogen having oxidative action on the above starting materials, $F_2$ gas was employed and introduced from the bomb 106 filling the gas via the introducing pipe 125 into the chamber 120. During this operation, the pressure in the vacuum chamber 120 was controlled to 10 Torr by a vacuum valve 119.

As the substrate, $Al_2O_3$ was used and the distance between the gas introducing inlet 111 and the substrate was set at 5 cm.

The relationships of $F_2$ flow rate with film thickness, optical band gap (Eg opt), and mobility are shown in Table 3.

In a similar manner as in the above Examples, samples were prepared for the measurement of film thickness, mobility and Eg opt, respectively.

The film thickness was determined with a layer thickness measuring apparatus of alpha-step (produced by TENCOR Co.) in the same manner as in Example 2. The mobility was measured by the usual FET method using a sample for the so-called FET method.

Eg opt was calculated by the TAUC plot method from the results obtained by spectrophotometric determination with a spectrophotometer (produced by HITACHI-SEISAKUSHO No. 330).

TABLE 3

| Sample No. | 1-6 | 1-7 | 1-8 | 1-9 | 1-10 |
|---|---|---|---|---|---|
| $F_2$ flow rate (sccm) | 5 | 10 | 20 | 40 | 80 |
| Film thickness (μm) | 0.8 | 1.2 | 1.5 | 2.0 | 2.5 |
| Mobility $\mu n$ ($cm^2V^{-1}s^{-1}$) | 5200 | 5000 | 5000 | 4800 | 4050 |
| $\mu p$ ($cm^2V^{-1}s^{-1}$) | 1400 | 1380 | 1400 | 1300 | 500 |
| Eg opt (eV) | 0.71 | 0.70 | 0.70 | 0.72 | 0.71 |

EXAMPLE 4

By means of the film-forming device shown in FIG. 1, deposited films according to the method of the present invention were prepared.

Here, of the III-V group compounds, AlAs, InAs, and InP were formed as examples. For example, with the use of the hydrogen gas filled in the bomb 104 as the carrier gas, it was introduced into a Dewar bottle 105 containing $Al(CH_3)_3$ to effect bubbling therein and the hydrogen gas containing saturated amount of $Al(CH_3)_3$ was introduced through the gas introducing inlet 110 into the vacuum chamber 120.

The gas flow rate at this time was 40 sccm with the amount of $Al(CH_3)_3$ fed being 0.08 ml/min.

On the other hand, arsine $AsH_3$ filled in the bomb 101 was introduced through the introducing pipe 123 at 40 sccm the gas introducing inlet 109 into the chamber 120.

As the gaseous halogen having oxidative action on the starting materials as described above, $F_2$ gas was employed and introduced from the filled bomb 106 through the introducing pipe 125 at a flow rate of 40 sccm into the chamber 120.

During this operation, the pressure in the vacuum chamber 120 was controlled to 500 mTorr by controlling the opening of the vacuum valve 119. By use of $Al_2O_3$ (2 cm×2 cm) as the substrate, the distance between the gas introducing inlet 111 and the substrate was set at 3 cm.

Similarly for the case when $Al(CH_3)_3$ and $AsH_3$ were introduced as the starting material gases and for the case when $In(C_2H_5)_3$ and $PH_3$ were introduced, the respective relationships of flow rate, inner pressure, substrate temperature, optical band gap (Eg opt), and mobility are shown in Table 4.

The film thickness, Eg opt and mobility were determined in the same manners as in Example 3.

TABLE 4

| Starting Material gas | Flow rate (sccm) | Inner pressure (Torr) | Substrate temperature (C.°) | Deposition speed (Å/s) | Film thickness (μm) | Mobility ($cm^2V^{-1}s^{-1}$) electron $\mu n$ | positive hole $\mu p$ | Eg opt (eV) |
|---|---|---|---|---|---|---|---|---|
| $In(C_2H_5)_3/H_2$ | 30 | 1.5 | 650 | 500 | 4 | 25000 | 320 | 0.4 |
| $AsH_3$ | 40 | | | | | | | |
| $F_2$ | 40 | | | | | | | |
| $Al(CH_3)_3/H_2$ | 40 | 0.8 | 800 | 1000 | 7 | 1400 | 400 | 2.1 |
| $AsH_3$ | 40 | | | | | | | |
| $F_2$ | 40 | | | | | | | |
| $In(C_2H_5)_3/H_2$ | 30 | 0.5 | 700 | 400 | 3 | 4000 | 200 | 1.30 |
| $PH_3$ | 20 | | | | | | | |
| $F_2$ | 40 | | | | | | | |

EXAMPLE 5

By means of the film forming device shown in FIG. 2, deposited films according to the method of the present invention were prepared.

Here, of the III-V compounds, InSb and AlSb were formed as examples. With the use of the hydrogen gases filled in the bombs 104 and 102 as the carrier gas, they were introduced into a Dewar bottle 105 containing $In(C_2H_5)_3$ and a Dewar bottle 101 containing $SbH_3$, respectively, to effect bubbling therein and hydrogen gases containing saturated amounts of $In(C_2H_5)_3$ and $SbH_3$ were introduced into the chamber 120 through the introducing inlets 110 and 109, respectively.

The gas flow rates at this time were each 30 sccm.

As the gaseous halogen having oxidative action on the above starting materials, $F_2$ gas was employed and introduced from the bomb 106 filling the gas via the introducing pipe 125 into the chamber 120. The flow rate was 40 sccm for $F_2$.

During this operation, the pressure in the vacuum chamber 120 was controlled to 0.5 Torr by vacuum valve 119.

As the substrate, $Al_2O_3$ was used and the distance between the gas introducing inlet 111 and the substrate was set at 5 cm.

Similarly, for the case when the Dewar bottle 105 is filled with $Al(CH_3)_3$, it is possible to obtain AlSb film depending on the film-forming conditions.

The relationships of gas flow rate, inner pressure, and substrate temperature conditions with deposition speed, film thickness t, mobility u, and optical band gap (Eg opt) are shown in Table 5.

The film thickness mobility, and Eg opt were measured in the same manners as in Example 3.

TABLE 5

| Starting Material gas | Flow rate (sccm) | Inner pressure (Torr) | Substrate temperature (C.°) | Deposition speed (Å/s) | Film thickness ($\mu$m) | Mobility ($cm^2V^{-1}s^{-1}$) electron $\mu n$ | positive hole $\mu p$ | Eg opt (eV) |
|---|---|---|---|---|---|---|---|---|
| $In(C_2H_5)_3/H_2$ | 30 | 20 | 350 | 500 | 5 | 75000 | 750 | 0.16 |
| $SbH_3/H_2$ | 30 | | | | | | | |
| $F_2$ | 40 | | | | | | | |
| $Al(CH_3)_3/H_2$ | 30 | 10 | 700 | 1000 | 1 | 150 | 400 | 1.5 |
| $SbH_3/H_2$ | 30 | | | | | | | |
| $F_2$ | 40 | | | | | | | |

Of the III-V compounds, it is also possible to deposit a three-element compound such as GaAlAs, etc. or a four-element compound according to the present invention.

In short, by increasing the number of the introducing pipes (not shown), the flow rates can be varied as desired to make compounds with different composition ratios.

As can be seen from the detailed description and the respective examples as set forth above, according to the deposition film-forming method of the present invention, deposited films having uniform physical properties over a large area can be obtained with easy management of film quality at the same time as achievement of energy saving. Also, it is possible to obtain easily film excellent in productivity and bulk productivity, and having high quality with excellent physical properties such as electrical, optical, and semiconductor properties, etc.

We claim:

1. A method for forming a deposited film on a substrate in a reaction space comprising:

introducing into a reaction space using a gas introducing conduit system (a) a gaseous starting material for formation of a deposited film, and (b) a gaseous halogenic oxidizing agent capable of oxidizing said starting material; said gaseous starting material being selected from the group consisting of compounds containing a Group III element, compounds containing a Group V element, and mixtures thereof; said gaseous halogenic oxidizing agent being selected from the group consisting of $F_2$, $Cl_2$, $Br_2$ and $I_2$ said gas introducing conduit system including a plurality of coaxially aligned conduits each having an exit orifice with an outer conduit adapted to carry said gaseous halogenic oxidizing agent and at least one inner conduit adapted to carry said gaseous starting material, said coaxially aligned conduits extending into the film forming space such that the exit orifices of the inner conduits are set back from the exit orifice of the outer conduit to enable the gaseous halogenic oxidizing agent in the outer conduit to surround the gaseous starting material exiting said inner conduit, said substrate positioned from 5 millimeters to 15 centimeters from the exit orifice of said outer conduit;

allowing said gaseous starting material and said gaseous halogenic oxidizing agent to contact each other thereby forming a plurality of precursors including precursors in an exicted state; and forming said deposited film on said substrate without the use of external discharge energy in the reaction space using at least one of said precursors.

2. A method for forming a deposited film according to claim 1, wherein said gaseous halogenic oxidizing agent is fluorine gas.

3. A method for forming a deposited film according to claim 1, wherein said gaseous halogenic oxidizing agent is chlorine gas.

4. A method for forming a deposited film according to claim 1, wherein said gaseous halogenic oxidizing agent is under nascent state.

5. A method for forming a deposited film according to claim 1, wherein said substrate is arranged at a position opposed to the direction in which said gaseous starting materials and said gaseous halogenic oxidizing agent are introduced into said reaction space.

6. A method for forming a deposited film according to claim 1, wherein said gaseous starting materials and said gaseous halogenic oxidizing agent are introduced into said reaction space through a transporting pipe of a multi-tubular structure.

* * * * *